(12) United States Patent
Bae et al.

(10) Patent No.: US 9,735,153 B2
(45) Date of Patent: Aug. 15, 2017

(54) SEMICONDUCTOR DEVICE HAVING FIN-TYPE FIELD EFFECT TRANSISTOR AND METHOD OF MANUFACTURING THE SAME

(71) Applicant: SAMSUNG ELECTRONICS CO., LTD., Suwon-si, Gyeonggi-do (KR)

(72) Inventors: Dong-Il Bae, Incheon (KR); Kang-Ill Seo, Chungcheongbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 38 days.

(21) Appl. No.: 14/330,306

(22) Filed: Jul. 14, 2014

(65) Prior Publication Data

US 2016/0013186 A1 Jan. 14, 2016

(51) Int. Cl.

| | |
|---|---|
| *H01L 27/088* | (2006.01) |
| *H01L 29/78* | (2006.01) |
| *H01L 29/66* | (2006.01) |
| *H01L 21/82* | (2006.01) |
| *H01L 29/161* | (2006.01) |
| *H01L 21/8234* | (2006.01) |
| *H01L 21/3105* | (2006.01) |
| *H01L 29/423* | (2006.01) |
| *H01L 29/775* | (2006.01) |

(Continued)

(52) U.S. Cl.
CPC .... *H01L 27/0886* (2013.01); *H01L 21/31053* (2013.01); *H01L 21/823431* (2013.01); *H01L 29/0673* (2013.01); *H01L 29/0847* (2013.01); *H01L 29/161* (2013.01); *H01L 29/42364* (2013.01); *H01L 29/6681* (2013.01); *H01L 29/66439* (2013.01); *H01L 29/775* (2013.01); *H01L 29/7851* (2013.01)

(58) Field of Classification Search
USPC .................. 257/288, 401; 438/283
See application file for complete search history.

(56) References Cited

U.S. PATENT DOCUMENTS

| | | | |
|---|---|---|---|
| 8,034,677 B2 | 10/2011 | Lin et al. | |
| 8,264,032 B2 | 9/2012 | Yeh et al. | |

(Continued)

FOREIGN PATENT DOCUMENTS

| | | |
|---|---|---|
| KR | 1020040070652 | 8/2004 |
| KR | 1020110078883 | 7/2011 |

*Primary Examiner* — Marvin Payen
*Assistant Examiner* — Vernon P Webb
(74) *Attorney, Agent, or Firm* — F. Chau & Associates, LLC

(57) ABSTRACT

A semiconductor device includes a first fin structure disposed on a substrate. The first fin structure extends in a first direction. A first sacrificial layer pattern is disposed on the first fin structure. The first sacrificial layer pattern includes a left portion and a right portion arranged in the first direction. A dielectric layer pattern is disposed on the first fin structure and interposed between the left and right portions of the first sacrificial layer pattern. A first active layer pattern extending in the first direction is disposed on the first sacrificial layer pattern and the dielectric layer pattern. A first gate electrode structure is disposed on a portion of the first active layer pattern. The portion of the first active layer is disposed on the dielectric layer pattern. The first gate electrode structure extends in a second direction crossing the first direction.

14 Claims, 20 Drawing Sheets

(51) Int. Cl.
*H01L 29/06* (2006.01)
*H01L 29/08* (2006.01)

(56) References Cited

U.S. PATENT DOCUMENTS

| | | |
|---|---|---|
| 2004/0235262 A1 | 11/2004 | Lee et al. |
| 2005/0019993 A1 | 1/2005 | Lee et al. |
| 2005/0202604 A1 | 9/2005 | Cheng et al. |
| 2005/0224880 A1* | 10/2005 | Lee .................. H01L 29/42392 257/347 |
| 2006/0292772 A1 | 12/2006 | Anderson et al. |
| 2009/0065853 A1* | 3/2009 | Hanafi ................ H01L 29/1054 257/327 |
| 2009/0189199 A1 | 7/2009 | Moriyama et al. |
| 2012/0193751 A1 | 8/2012 | Kawasaki et al. |
| 2012/0235238 A1 | 9/2012 | Cheng et al. |

* cited by examiner

13

1200

1300

1400

SEMICONDUCTOR DEVICE HAVING FIN-TYPE FIELD EFFECT TRANSISTOR AND METHOD OF MANUFACTURING THE SAME

TECHNICAL FIELD

The present inventive concept relates to a semiconductor device having a fin-type field effect transistor (FinFET), and a method of manufacturing the same.

DISCUSSION OF RELATED ART

FinFET devices refer to three-dimensional (3D), multi-gate transistors of which a conducting channel is formed of a fin- or nanowire-shaped silicon body and a gate is formed on such silicon body. As feature sizes have become more fine, high leakage current due to short-channel effects may deteriorate device performance.

SUMMARY

According to an exemplary embodiment of the present inventive concept, a semiconductor device includes a first fin structure disposed on a substrate. The first fin structure extends in a first direction. A first sacrificial layer pattern is disposed on the first fin structure. The first sacrificial layer pattern includes a left portion and a right portion arranged in the first direction. A dielectric layer pattern is disposed on the first fin structure and interposed between the left portion and the right portion of the first sacrificial layer pattern. A first active layer pattern is disposed on the first sacrificial layer pattern and the dielectric layer pattern. The first active layer pattern extends in the first direction. A first gate electrode structure is disposed on a portion of the first active layer pattern. The portion of the first active layer is disposed on the dielectric layer pattern. The first gate electrode structure extends in a second direction crossing the first direction.

According to an exemplary embodiment of the present inventive concept, a semiconductor device is provided. The semiconductor device includes a fin structure protruding from a substrate. The fin structure extends in a first direction. A first epitaxial layer pattern is disposed on the fin structure. The first epitaxial layer pattern includes silicon germanium (SiGe). The first epitaxial layer is divided into a left portion and a right portion arranged in the first direction. A dielectric layer pattern is interposed between the left portion and the right portion of the first epitaxial layer pattern. A second epitaxial layer pattern is disposed on the sacrificial layer pattern and the dielectric layer pattern. The second epitaxial layer pattern extends in the first direction. A gate electrode structure is disposed on the second epitaxial layer pattern. The gate electrode structure extends in a second direction crossing the first direction. The gate electrode structure covers an upper surface and a sidewall of the second epitaxial layer pattern and a sidewall of the dielectric layer pattern. A third epitaxial layer pattern is disposed on both sides of the gate electrode structure. The third epitaxial layer pattern covers a portion of the upper surface and a sidewall of the second epitaxial layer pattern.

According to an exemplary embodiment of the present inventive concept, a method of manufacturing a semiconductor device is provided. A fin structure is formed on a substrate. The fin structure extends in a first direction. A sacrificial layer pattern is formed on an upper surface of the fin structure. The sacrificial layer pattern includes a first portion and a second portion. An active layer pattern including a first portion and a second portion is formed on the sacrificial layer pattern. The first portion of the active layer pattern is formed on the first portion of the sacrificial layer pattern. The second portion of the active layer pattern is formed on the second portion of the sacrificial layer pattern. A dummy gate pattern is formed on the first portion of the active layer pattern. The dummy gate pattern extends in a second direction crossing the first direction. The dummy gate pattern covers an upper surface and a sidewall of the first portion in the active layer pattern, and a sidewall of the first portion in the sacrificial layer pattern. An interlayer dielectric layer is formed on the dummy gate pattern and the second potion of the active layer pattern. The interlayer dielectric layer is planarized to expose the dummy gate pattern. The dummy gate pattern is removed to expose the first portion of the active layer pattern and the first portion of the sacrificial layer pattern. The exposed first portion of the sacrificial layer pattern is removed to form a space between the exposed first portion of the active layer pattern and the upper surface of the fin structure. A dielectric layer pattern is formed in the space. A gate electrode structure is formed on the exposed first portion of the active layer pattern. The gate electrode structure covers an upper surface and a sidewall of the exposed first portion of the active layer pattern.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
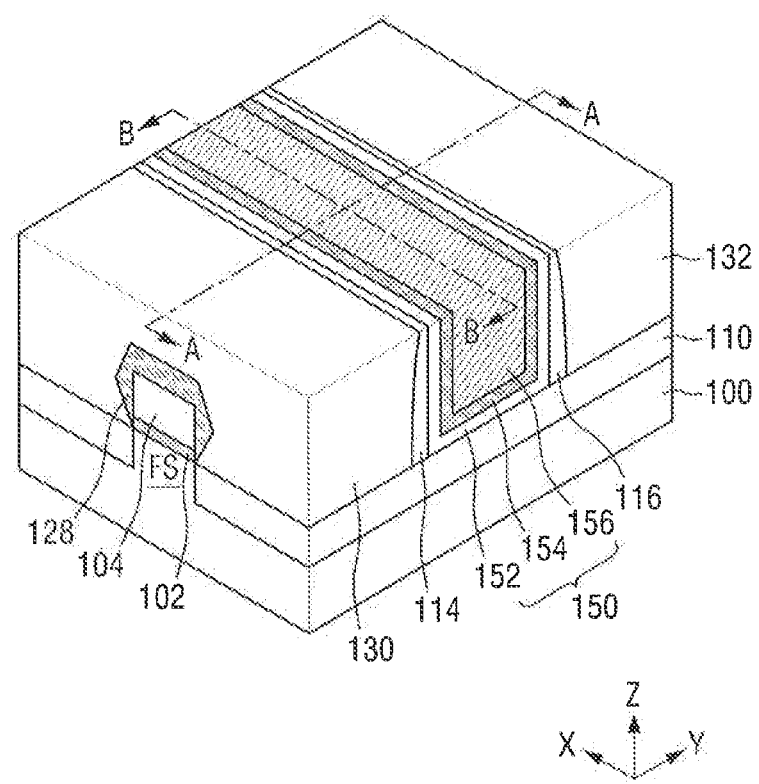
FIG. 1 is a perspective view illustrating a semiconductor device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
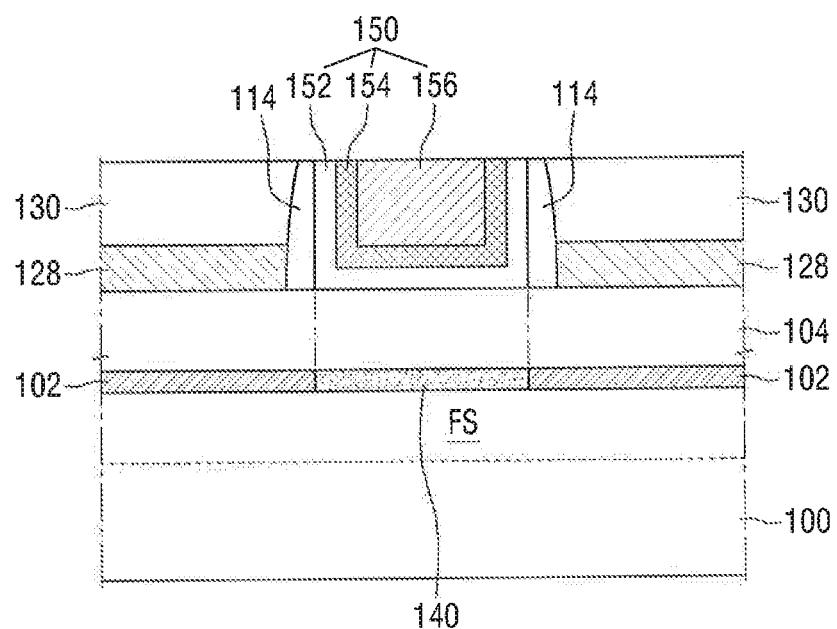
FIG. 2 is a cross-sectional view corresponding to line A-A of FIG. 1.
Figure 3:
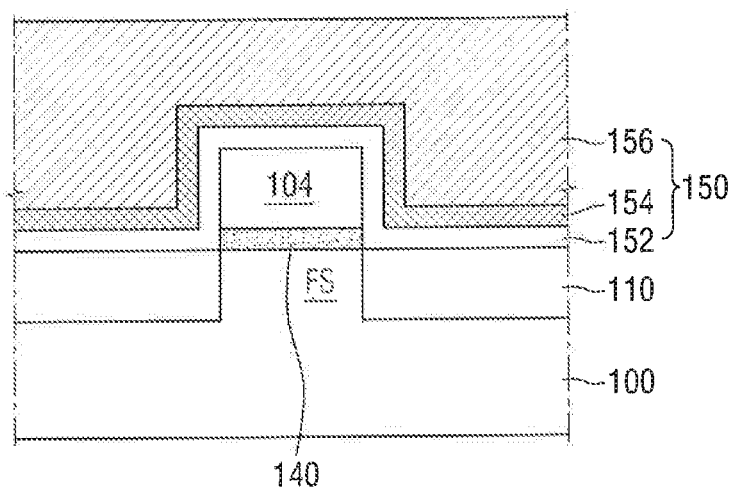
FIG. 3 is a cross-sectional view corresponding to line B-B of FIG. 1.

FIG. 1 is a perspective view illustrating a semiconductor device according to an exemplary embodiment of the inventive concept. FIGS. 2 and 3 are cross-sectional views corresponding to lines A-A and B-B of FIG. 1, respectively.

Referring to FIGS. 1 through 3, a semiconductor device may include a substrate 100, a fin structure FS, a sacrificial layer pattern 102, an active layer pattern 104, a source/drain structure 128, a dielectric layer pattern 140, and a gate electrode structure 150.

Hereinafter, the semiconductor device according to the exemplary embodiment of the inventive concept will be described in detail with reference to a fin-type field effect transistor (FinFET), but is not limited thereto.

The substrate 100 may include a bulk silicon substrate or a silicon-on-insulator (SOI) substrate. The substrate 100 may include silicon (Si), germanium (Ge), silicon germanium (SiGe), indium antimonide (InSb), lead telluride (PbTe), indium arsenide (InAs), indium phosphide (InP), gallium arsenide (GaAs), and/or gallium antimonide (GaSb).

The substrate 100 may also include an epitaxial layer formed on a base substrate. If an active fin pattern is formed by using the epitaxial layer, the epitaxial layer may include silicon (Si) or germanium (Ge). The epitaxial layer may also include a compound semiconductor, for example, a 4-4 group compound semiconductor or a 3-5 group compound semiconductor. The 4-4 group compound semiconductor may be a binary compound or a ternary compound having at least two materials of carbon (C), silicon (Si), germanium (Ge), and stannum (Sn). The 3-5 group compound semiconductor may be a binary compound, a ternary compound, or a quaternary compound having at least two materials of aluminum (Al), gallium (Ga), indium (In), phosphorus (P), arsenic (As), and antimony (Sb).

A fin structure FS may be formed on the substrate 100 and protruded to a first direction (Z-axis) from the substrate 100. According to an exemplary embodiment of the inventive concept, the fin structure FS may be formed of the same material with the substrate 100. Alternatively, the fin structure FS may include a different material from the substrate 100. Alternatively, the fin structure FS may be formed by partially etching the substrate 100.

The fin structure FS may have a tapered shape having a larger bottom width or a rectangular shape having substantially the same width at the top and at the bottom. The top edge of the fin structure FS may have a rounded shape.

A device isolation structure 110 may be formed on the substrate 100 and may cover a sidewall of the fin structure FS. The device isolation structure 110 may be formed of an insulating layer, for example, a silicon oxide layer, a silicon nitride layer, or a silicon oxynitride layer, but is not limited thereto.

Alternatively, the device isolation structure 110 may have a shallow-trench-isolation (STI) structure or a deep-trench-isolation (DTI) structure.

A sacrificial layer pattern 102 may be formed on the fin structure FS. The sacrificial layer pattern 102 may include a semiconductor material, for example, silicon germanium (SiGe). If the sacrificial layer pattern 102 includes silicon germanium (SiGe), the proportion of germanium (Ge) in the sacrificial layer pattern 102 may be higher than that of silicon (Si) in the sacrificial layer pattern 102 for increasing etching selectivity of the sacrificial layer pattern 102 from the other layers which have a lower proportion of germanium (Ge). The sacrificial layer pattern 102 may be divided into a left portion and a right portion in a second direction (Y-axis).

A dielectric layer pattern 140 may be formed between the left portion and the right portion of the sacrificial layer pattern 102.

An active layer pattern 104 having a first portion and a second portion may be formed on the sacrificial layer pattern 102 and the dielectric layer pattern 140. The first portion of the active layer pattern 104 may be formed on the dielectric layer pattern 140 and the second portion of the active layer pattern 102 may be formed on the sacrificial layer pattern 102. The active layer pattern 104 may be extended in the second direction (Y-axis). The active layer pattern 104 may include a silicon layer or a 3-5 group compound semiconductor formed by using an epitaxial growth process. The active layer pattern 104 may be formed of substantially the same material with the fin structure FS. The first portion of the active layer pattern 104 may serve as a channel region of a fin-type field effect transistor (FinFET) and the second portion of the active layer pattern 104 may serve as a part of a source/drain region of the fin-type field effect transistor (FinFET).

A gate electrode structure 150 may be formed on the active layer pattern 140. The gate electrode structure 150 may cross over the first portion of the active layer pattern 104 and be extended in a third direction (X-axis). The gate electrode structure 150 may include a gate dielectric layer 152, a work-function control layer 154, and a metal gate electrode layer 156.

A spacer 114 may be formed at both sidewalls of the gate electrode structure 150, respectively. The spacer 114 may be formed of an insulating layer, for example, a silicon oxide layer, a silicon nitride layer, or a silicon oxynitride layer. In this case, the gate dielectric layer 152 may be formed on the active layer pattern 104 and extended upwardly along an inner sidewall of the spacer 114 as shown in FIG. 2. The gate dielectric layer 152 may include a high-k dielectric layer, for example, a hafnium oxide layer, an aluminum oxide layer, a zirconium oxide layer, or a tantalum oxide layer.

An interfacial layer may be formed between the gate dielectric layer 152 and the active layer pattern 104. The interfacial layer may be formed of a low-k dielectric layer having a dielectric constant less than 9. For example, the interfacial layer may be formed of a silicon oxide layer, a silicon oxynitride layer, or a mixture thereof.

The work-function control layer 154 may be formed on the gate dielectric layer 152. The work-function control layer 154 may be extended in the first direction (Z-axis) along the sidewalls of the metal gate electrode layer 156 and the spacer 114. The work-function control layer 154 may control the work-function of the fin-type field effect transistor.

If the fin-type field effect transistor is a P-type Metal Oxide Semiconductor (PMOS) transistor, the work-function control layer 154 may include a p-type work-function control layer, for example, titanium nitride (TiN), tantalum nitride (TaN), or a mixture thereof.

The metal gate electrode layer 156 may be formed on the work-function control layer 154. The metal gate electrode layer 156 may include aluminum (Al), tungsten (W), or a mixture thereof.

A source/drain structure 128 may be formed on the second portion of the active layer pattern 104 and at both sides of the gate electrode structure 150. The source/drain structure 128 may be formed by using a selective epitaxial growth process and may cover a portion of the sidewall of the active layer pattern 104, but is not limited thereto.

Alternatively, the source/drain structure 128 may be formed, without any epitaxial layer, in the active layer pattern 104 by injecting impurities therein using an ion implantation process. For example, if the fin-type field effect transistor is a PMOS transistor, the source/drain structure 128 may include p-type impurities.

An interlayer dielectric layer 130 may be formed on the device isolation structure 110. The interlayer dielectric layer 130 may cover the sacrificial layer pattern 102 and the source/drain structure 128.

According to an exemplary embodiment of the inventive concept, the dielectric layer pattern 140 may be formed under the first portion of the active layer pattern 104. The dielectric layer pattern 140 may serve to reduce leakage current of the fin-type field effect transistor compared to that of a planar-type field effect transistor. As the result, the reliability and the performance of the fin-type field effect transistor may be increased.

Figure 4:
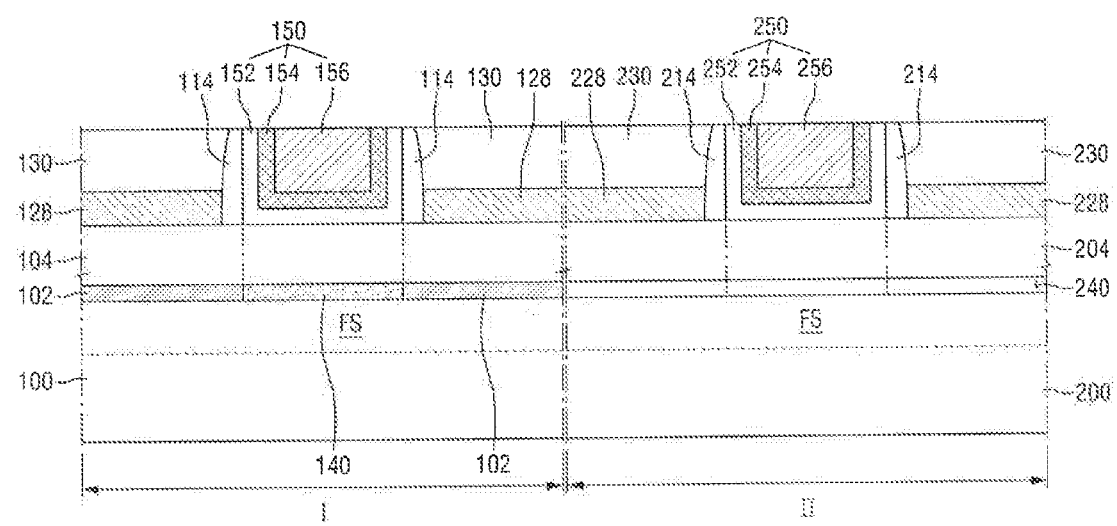
FIG. 4 is a cross-sectional view illustrating a semiconductor device according to an exemplary embodiment of the inventive concept.

FIG. 4 is a cross-sectional view illustrating a semiconductor device according to an exemplary embodiment of the inventive concept. For the convenience of description, the description of the same elements as in the above embodiment will be omitted.

Referring to FIG. 4, the substrate 100 may include a first region I and a second region II. A first fin-type field effect transistor may be formed in the first region I and a second fin-type field effect transistor may be formed in the second region II.

The first fin-type field effect transistor may be substantially the same fin-type field effect transistor as described referring to FIG. 2. Therefore, the detail description of the first fin-type field effect transistor will be omitted to simplify the explanation.

The second fin-type field effect transistor formed in the second region II may include a fin structure FS, a sacrificial layer pattern 240, an active layer pattern 204, a source/drain structure 228, and a gate electrode structure 250.

The active layer pattern 204, the source/drain structure 228, and the gate electrode structure 250 may be substantially the same as the corresponding elements as described with reference to FIG. 2, and thus the detail description thereof will be omitted herein.

The sacrificial layer pattern 240 of the second fin-type field effect transistor formed in the second region II may be formed of an insulating film. Therefore, the insulating film may be formed not only under the source/drain region 228 but also under the gate electrode structure 250. The insulating film may be extended in the second direction (Y-axis).

The first fin-type field effect transistor formed in the first region I and the second fin-type field effect transistor formed in the second region II may have different conductivity types from each other. For example, the first fin-type field effect transistor may be a PMOS transistor and the second fin-type field effect transistor may be an N-type Metal Oxide Semiconductor (NMOS) transistor. Alternatively, the first and second fin-type field effect transistors may have the same conductivity types as each other.

The sacrificial layer pattern 102 formed in the first region I may include a material different from materials disposed in the sacrificial layer pattern 240 formed in the second region II.

Figure 5:
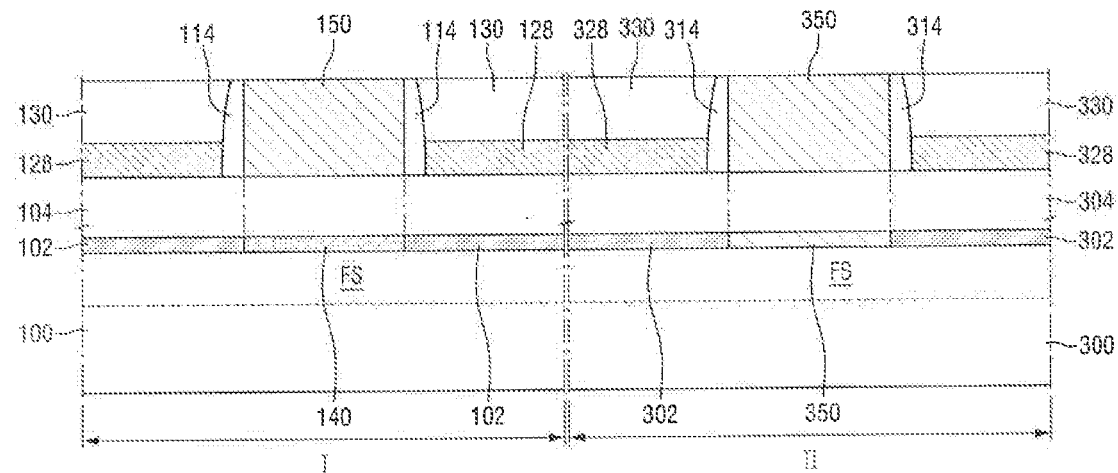
FIGS. 5 and 6 are cross-sectional views illustrating a semiconductor device according to an exemplary embodiment of the inventive concept.
Figure 6:
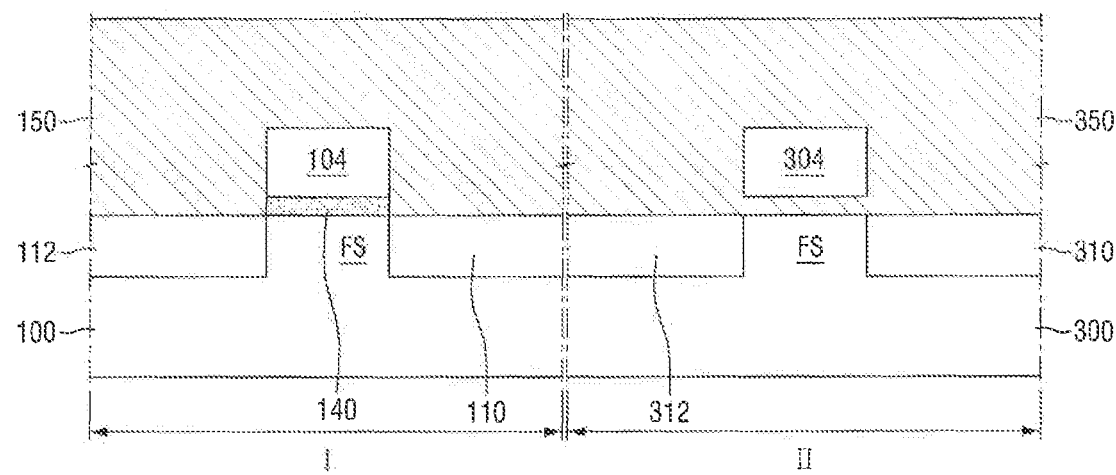

FIGS. 5 and 6 are cross-sectional views illustrating a semiconductor device according to an exemplary embodiment of the inventive concept.

Referring to FIGS. 5 and 6, the substrate 100 may include a first region I and a second region II. A first fin-type transistor may be formed in the first region I and a second fin-type transistor may be formed in the second region II.

The first fin-type field effect transistor may be substantially the same as the fin-type field effect transistor of FIG. 2. The detail description thereof will be omitted herein.

The second fin-type field effect transistor formed in the second region II may include a fin structure FS, a sacrificial layer pattern 302, an active layer pattern 304, a source/drain structure 328, a gate electrode structure 350, a spacer 314, and a interlayer dielectric layer 330.

The sacrificial layer pattern 302, the active layer pattern 304, the source/drain structure 328, the spacer 314, and the interlayer dielectric layer 330 are substantially the same as the corresponding elements as described with reference to FIGS. 2 and 3, and thus the detail description thereof will be omitted herein.

The gate electrode structure 350 of the second fin-type transistor formed in the second region II may surround a portion of the active layer pattern 304.

Figure 7:
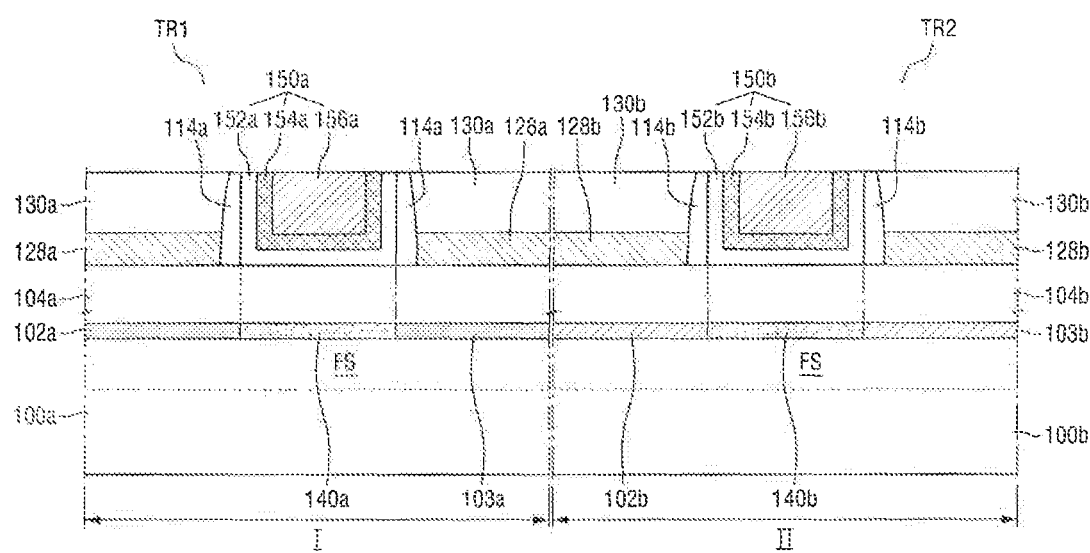
FIG. 7 is a cross-sectional view illustrating a semiconductor device according to an exemplary embodiment of the inventive concept.

FIG. 7 is a cross-sectional view illustrating a semiconductor device according to an exemplary embodiment of the inventive concept.

Referring to FIG. 7, a substrate 100 may include a first region I and a second region II. A first fin-type transistor TR1 may be formed in the first region I and a second fin-type transistor TR2 may be formed in the second region II.

The first fin-type field effect transistor TR1 formed in the first region I may be substantially the same as the fin-type field effect transistor of FIG. 2. For example, an active layer pattern 104a, a source/drain structure 128a, a gate electrode structure 150a, a spacer 114a, and an interlayer dielectric layer 130a of the first fin-type field effect transistor TR1 in FIG. 7 may be substantially the same as the corresponding elements them of the fin-type field effect transistor described referring to FIG. 2.

The second fin-type field effect transistor TR2 formed in the second region II may be substantially the same fin-type field effect transistor as described referring to FIG. 2. For example, an active layer pattern 104b, a source/drain structure 128b, a gate electrode structure 150b, a spacer 114b, and an interlayer dielectric layer 130b of the second fin-type field effect transistor TR2 may be substantially the same as the corresponding elements as described with reference to FIG. 2. However, a first germanium concentration of the sacrificial layer pattern 102a formed in the first region I may be different from a second germanium concentration of the sacrificial layer pattern 102b formed in the second region II.

The first fin-type field effect transistor TR1 formed in the first region I and the second fin-type field effect transistor TR2 formed in the second region II may have different conductivity types from each other. For example, the first fin-type field effect transistor TR1 may be a PMOS transistor and the second fin-type field effect transistor TR2 may be an NMOS transistor. In this case, the first germanium concentration of the first fin-type field effect transistor may be greater than the second germanium concentration of the second fin-type field effect transistor.

The sacrificial layer pattern 102a formed in the first region I may include a material different from a material disposed in the sacrificial layer pattern 102b formed in the second region II.

Figure 15:
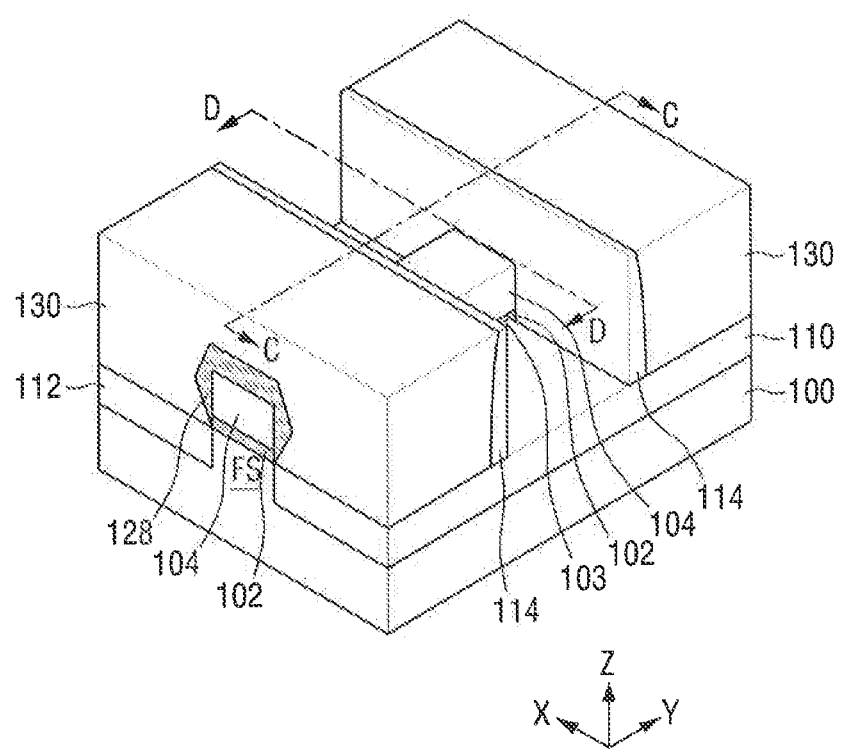
Figure 16:
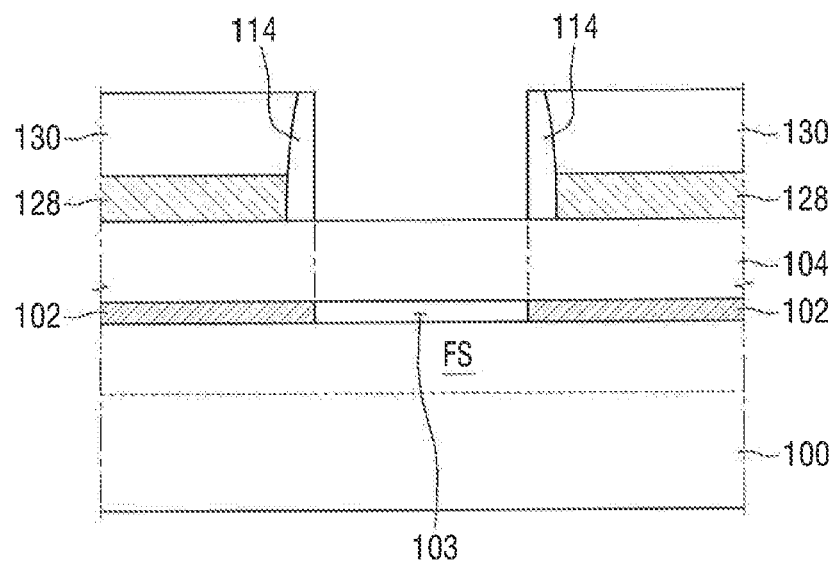
Figure 17:
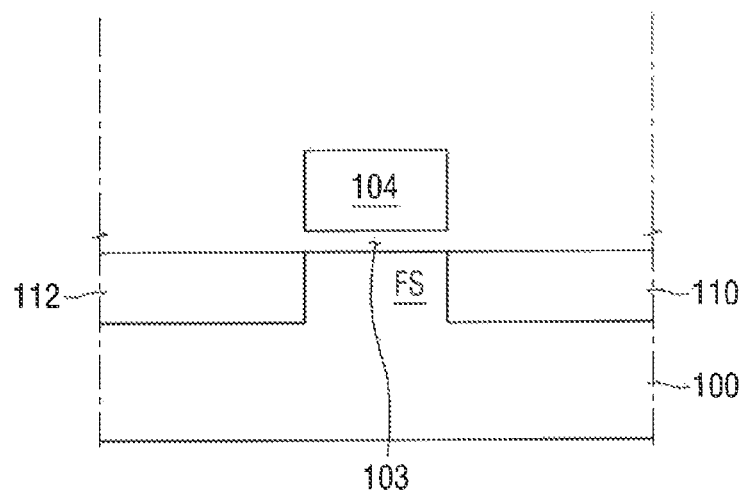
Figure 18:
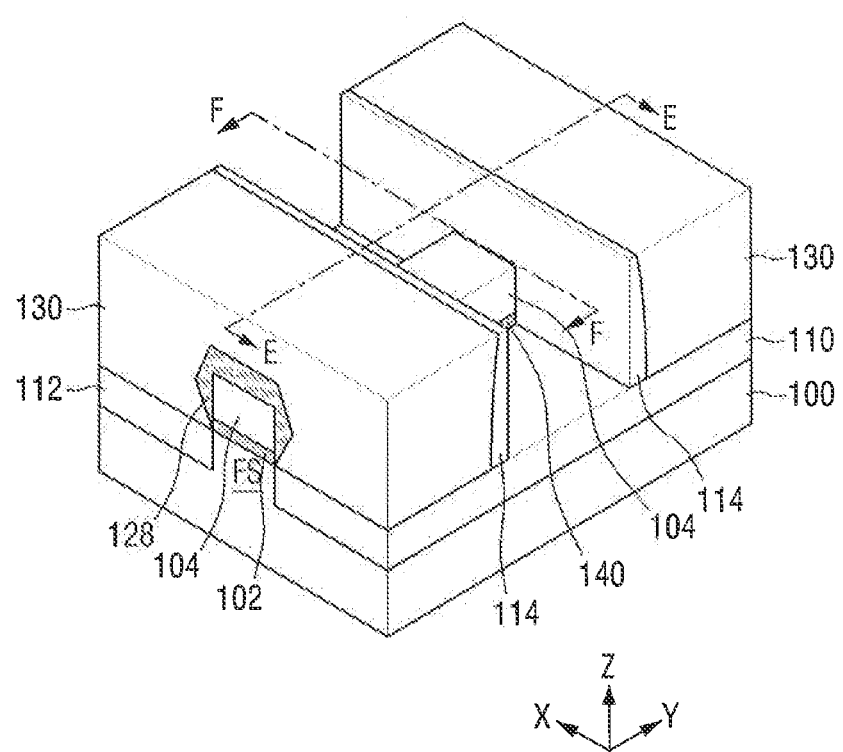
Figure 19:
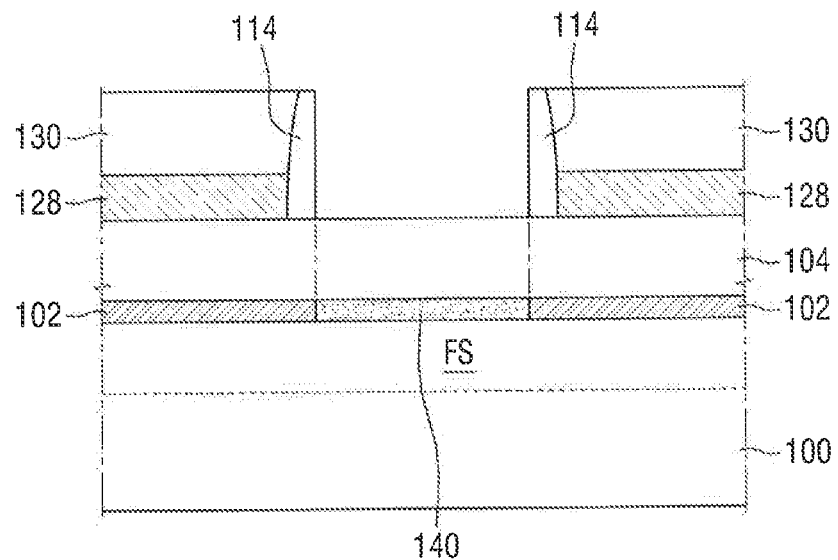
Figure 20:
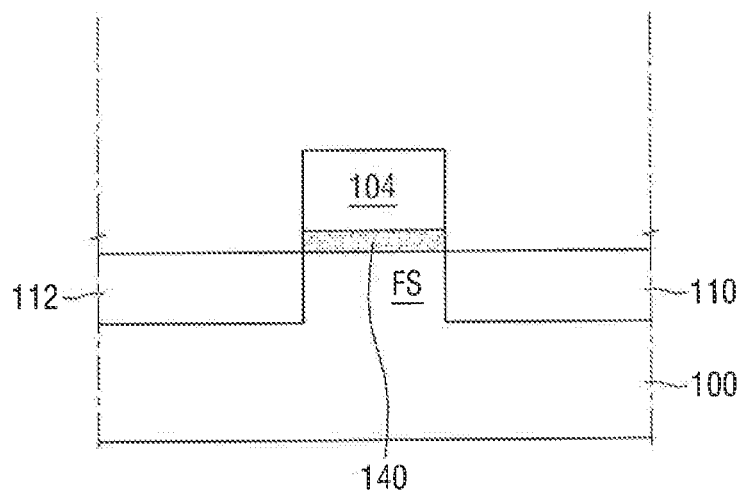

FIGS. 8 through 20 are cross-sectional views illustrating a method of manufacturing a semiconductor device according to an exemplary embodiment of the inventive concept. FIG. 16 is a cross-sectional view corresponding to line C-C of FIG. 15, FIG. 17 is a cross-sectional view corresponding to line D-D of FIG. 15, FIG. 19 is a cross-sectional view corresponding to line E-E of FIG. 18, and FIG. 20 is a cross-sectional view corresponding to line F-F of FIG. 18.

Figure 8:
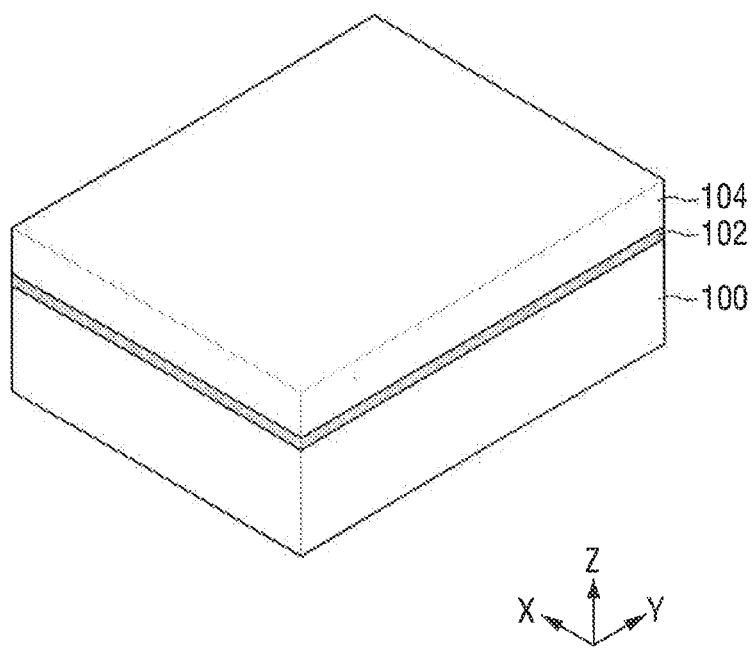
FIGS. 8 through 20 are cross-sectional views illustrating a method of manufacturing a semiconductor device according to an exemplary embodiment of the inventive concept.

Referring to FIG. 8, a sacrificial layer 102 may be formed on a substrate 100 by using an epitaxial growth process. The sacrificial layer may include a semiconductor material, for example, silicon germanium (SiGe). An active layer 104 may be formed on the sacrificial layer 104 by using another epitaxial growth process. The active layer 104 may include silicon (Si).

Figure 9:
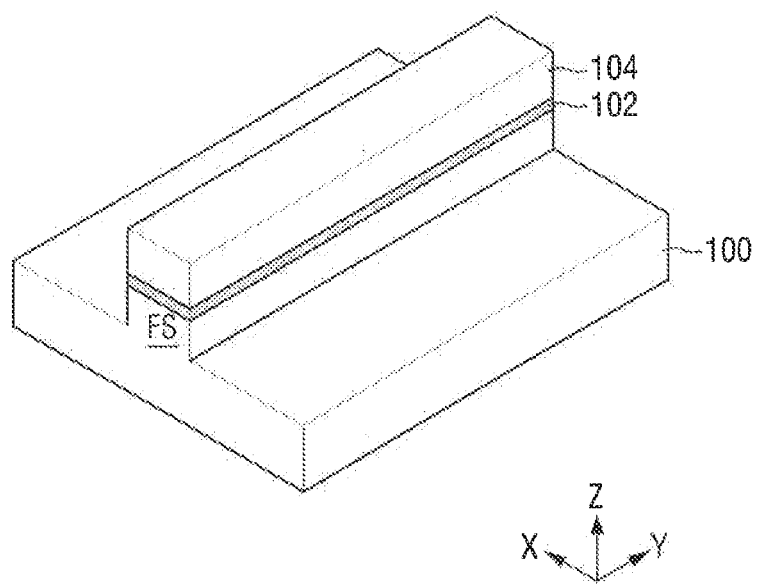

Referring to FIG. 9, the active layer 104, the sacrificial layer 102, and the substrate 100 may be successively etched to form a fin structure FS, a sacrificial layer pattern 102, and an active layer pattern 104.

Figure 10:
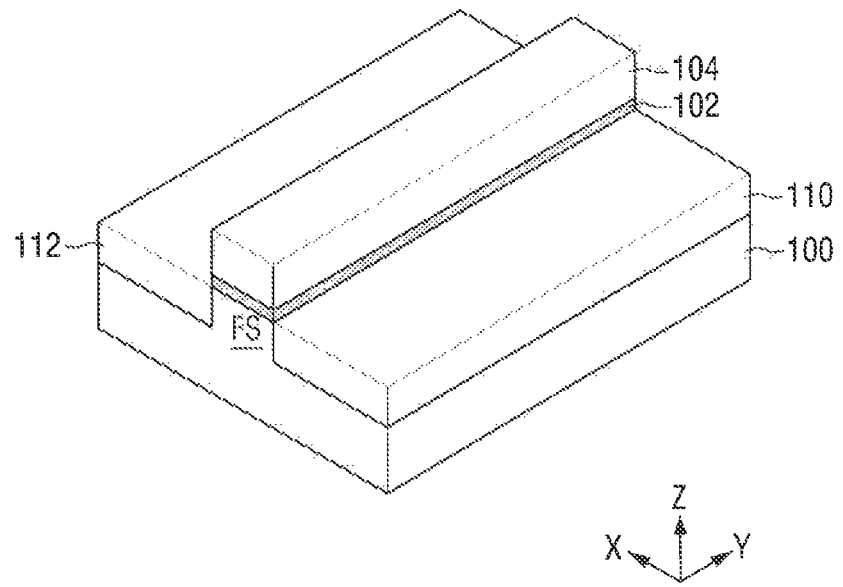

Referring to FIG. 10, a device isolation structure 110 may be formed on the substrate 100. The device isolation structure 110 may cover a sidewall of the fin structure FS.

Alternatively, the fin structure FS, the sacrificial layer pattern 102, and the active layer pattern 104 may be formed on a silicon-on-insulator (SOI) substrate by using multiple epitaxial growth processes. For example, a first epitaxial layer including silicon (Si) may be formed on a substrate having an insulating layer thereon and a second epitaxial layer including silicon germanium (SiGe) may be formed on the first epitaxial layer, and a third epitaxial layer including silicon (Si) may be formed on the second epitaxial layer. The third, the second, and the first epitaxial layer may be successively etched using a mask pattern to form the active layer pattern 104, the sacrificial layer pattern 102, and the fin structure which are formed on the silicon-on-insulator (SOI) substrate.

Figure 11:
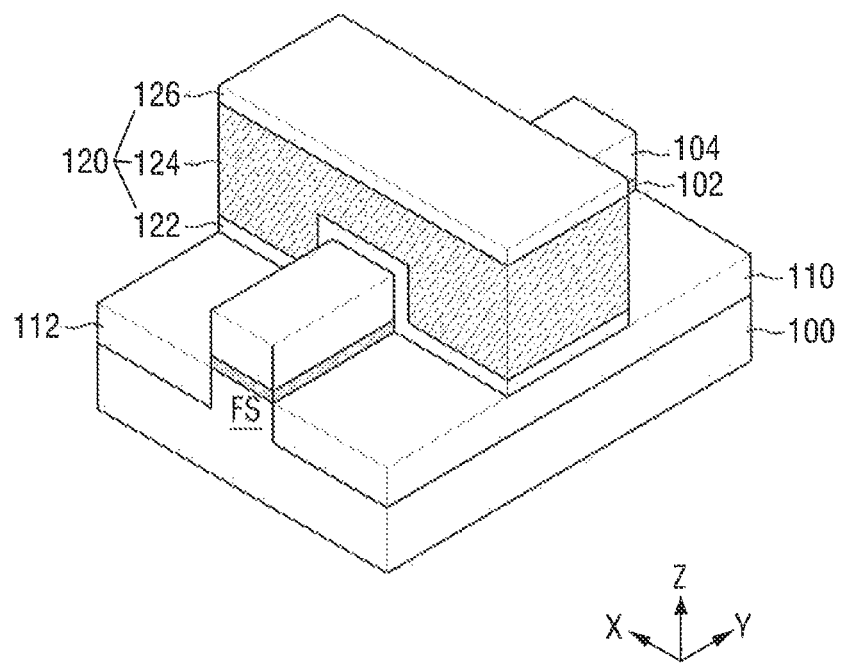

Referring to FIG. 11, a dummy gate structure 120 may be formed on the active layer pattern 104. The dummy gate structure 120 may cross over the active layer pattern 104 and be extended in a third direction (X-axis). The dummy gate structure 120 may cover a sidewall of the active layer pattern 104 and a sidewall of the sacrificial layer pattern 102. The dummy gate structure 120 may include a dummy gate dielectric layer 122, a dummy gate layer 124, and a hard mask 126.

The dummy gate dielectric layer 122 may include a silicon oxide layer, and the dummy gate layer 124 may include a poly silicon layer, and the hard mask 126 may include a silicon nitride layer.

Figure 12:
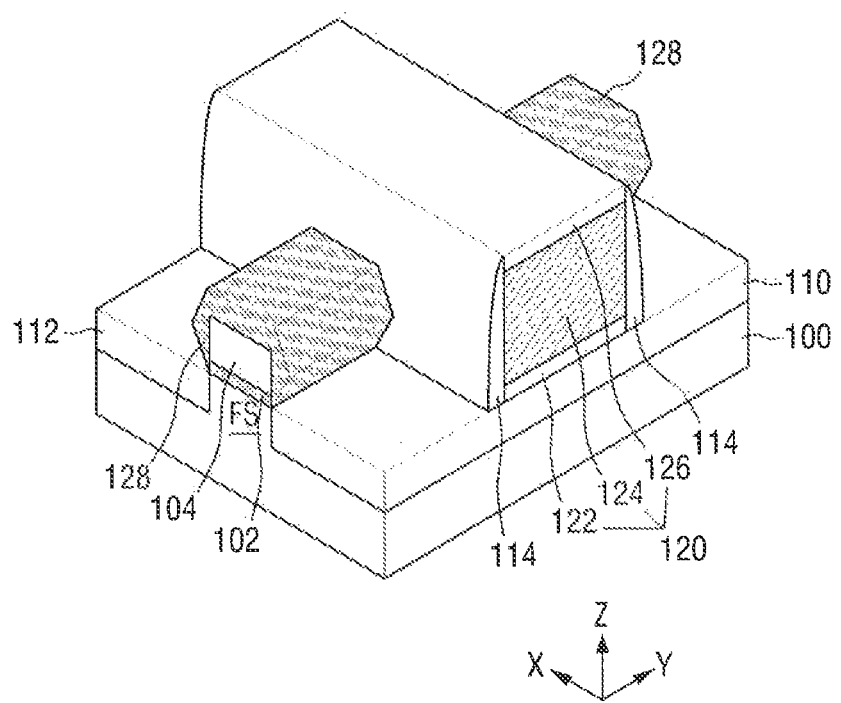

Referring to FIG. 12, an insulating layer may be formed on the dummy gate structure 120. The insulating layer may be etched using an anisotropic etching process to form a spacer 114 on the sidewall of the dummy gate structure 120. A source/drain structure 128 may be formed at both sides of the dummy gate structure 120. The source/drain structure 128 may be formed on the active layer pattern 104 using an epitaxial growth process. The source/drain structure 128 may cover a portion of the sidewall of the sacrificial layer pattern 102 and a portion of the sidewall of the active layer pattern 104. The epitaxial growth process may be performed after recessing an upper portion of active layer pattern 104.

Alternatively, the source/drain structure 128 may be formed using an ion implantation process instead of the epitaxial growth process as described above. For example, an impurity may be injected into the active layer pattern disposed at both sides of the dummy gate structure 120 to form a source/drain structure 128.

Figure 13:
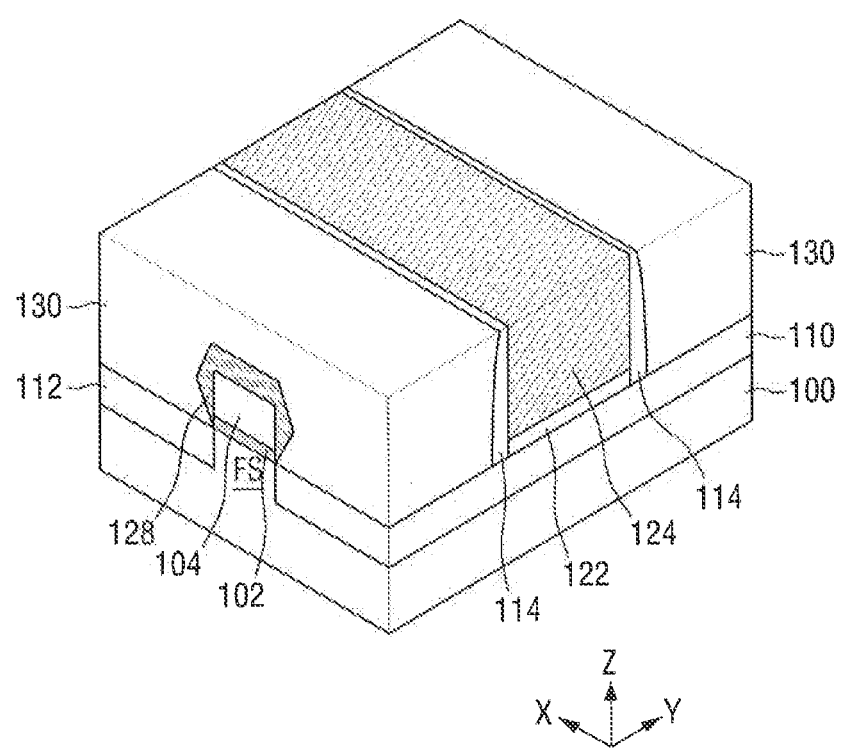

Referring to FIG. 13, an interlayer dielectric layer 130 may be formed on the source/drain structure 128 and the dummy gate structure 120. The interlayer dielectric layer 130 may be planarized to expose an upper surface of the dummy gate structure 120 by using a planarization process, for example, a chemical mechanical polishing (CMP) process. The hard mask 126 may be removed after or during the planarization process. The interlayer dielectric layer 130 may include a silicon oxide layer or a silicon oxynitride layer, but is not limited thereto.

Figure 14:
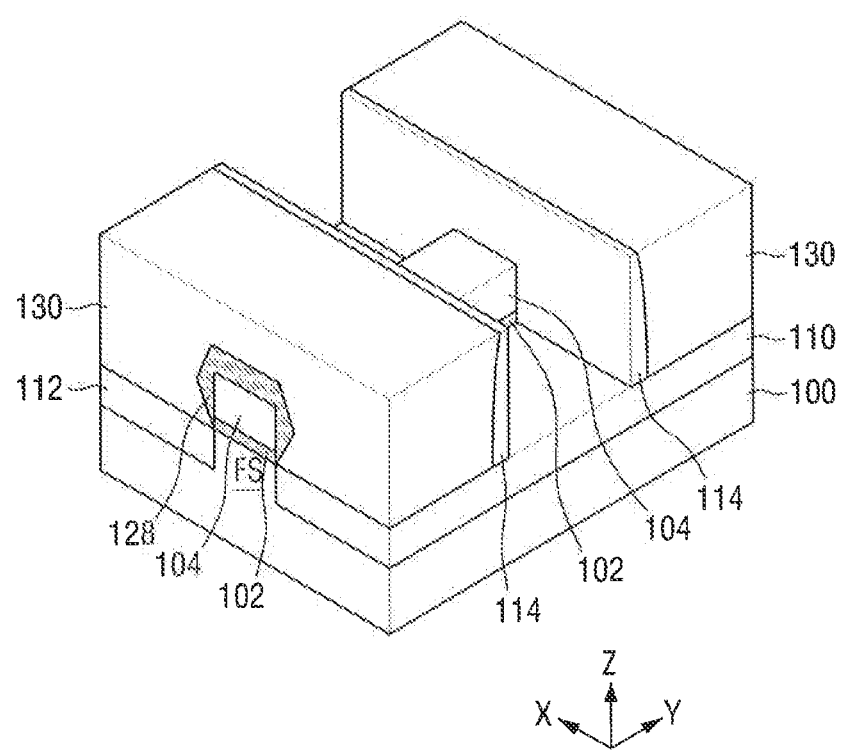

Referring to FIG. 14, the dummy gate layer 124 and the dummy gate dielectric layer 122 may be removed to expose a portion of the active layer pattern 104 and a portion of a sidewall of the sacrificial layer pattern 102. For example, the dummy gate layer 124 may be removed using a dry etch process and the dummy gate dielectric layer 122 may be removed using a wet etch process, but is not limited thereto.

Referring to FIGS. 15 through 17, the exposed portion of the sacrificial layer pattern 102 may be removed using a selective etching process.

The sacrificial layer pattern 102 including silicon germanium (SiGe) may have etch selectivity with respect to the active layer pattern that is formed of silicon (Si). For example, the exposed sacrificial layer pattern 102 may be removed using a hydrochloric acid (HCl) to form a through-hole 103 which is disposed between the active layer pattern 104 and the device isolation structure 110.

Referring to FIGS. 18 through 20, a dielectric layer pattern 140 may be formed in the through-hole 103. The dielectric layer pattern 140 may be formed between the divided sacrificial layer patterns 102.

Referring to FIGS. 1 through 3 again, the gate dielectric layer 152 may be formed on the exposed upper surface and sidewall of the active layer pattern 104. The gate dielectric layer 152 may be further formed on the sidewall of the dielectric layer pattern 140.

The work-function control layer 154 may be formed on the gate dielectric layer 152, and the metal gate electrode layer 156 may be formed on the work-function control layer 154.

Figure 21:
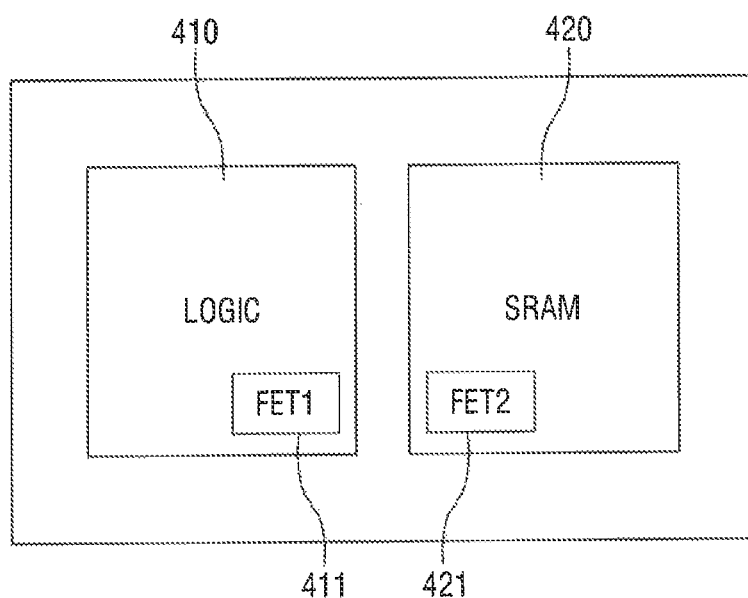
FIG. 21 is a block diagram illustrating a semiconductor device according to an exemplary embodiment of the inventive concept.
Figure 22:
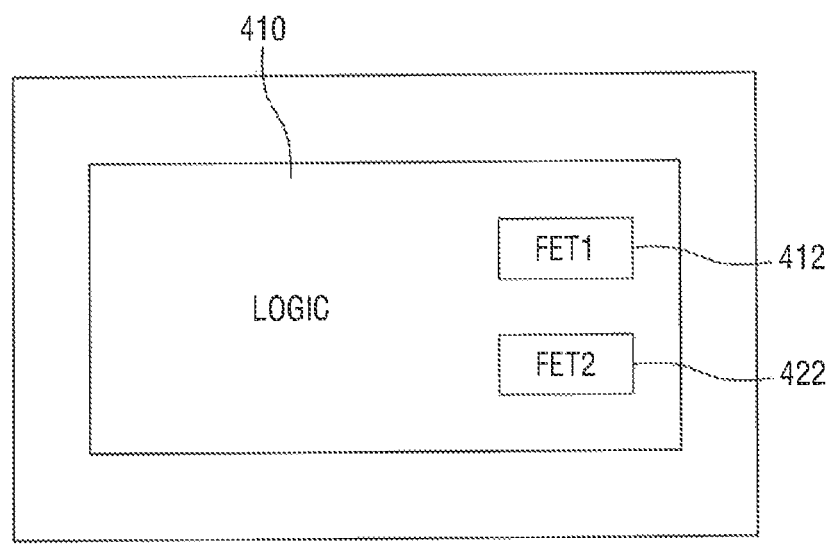
FIG. 22 is a block diagram illustrating a semiconductor device according to an exemplary embodiment of the inventive concept.

FIG. 21 is a block diagram illustrating a semiconductor device according to an exemplary embodiment of the inventive concept. FIG. 22 is a block diagram illustrating a semiconductor device according to an exemplary embodiment of the inventive concept.

Referring to FIG. 21, a semiconductor device 13 may include a logic region 410 and a static random access memory (SRAM) region 420. A first transistor 411 may be disposed in the logic region 410, and a second transistor 421 may be disposed in the SRAM region 420. The types of the first transistor 411 and the second transistor 421 may be different from each other. For example, the first fin-type field effect transistor TR1 of FIG. 7 may be applied to the first transistor 411 and the second fin-type field effect transistor TR2 of FIG. 7 may be applied to the second transistor 421, respectively. Alternatively, the types of the first transistor 411 and the second transistor 421 may be the same. For example, the first fin-type field effect transistor TR1 of FIG. 7 may be applied to the first transistor 411 and the second transistor 421.

Alternatively, the SRAM region may be replaced to a Dynamic Random Access Memory (DRAM) region, a Magnetoresistive Random Access Memory (MRAM) region, a Resistive Random Access Memory (RRAM) region, or a Phase-Change Random Access Memory (PRAM) region. Alternatively, the semiconductor device may include at least one of the DRAM region, the MRAM region, the RRAM region, and the PRAM region in addition to the SRAM region and the logic region.

Referring to FIG. 22, a semiconductor device 14 may include a logic region 410 including a third transistor 412 and a fourth transistor 422. The types of the third transistor 412 and the fourth transistor 422 may be different from each other. For example, the first fin-type field effect transistor TR1 of FIG. 7 may be applied to the third transistor 412 and the second fin-type field effect transistor TR2 of FIG. 7 may be applied to the fourth transistor 422, respectively. Alternatively, the types of the third transistor 412 and the fourth transistor 422 may be the same. For example, the first fin-type field effect transistor TR1 of FIG. 7 may be applied to the third transistor 412 and the fourth transistor 422.

Figure 23:
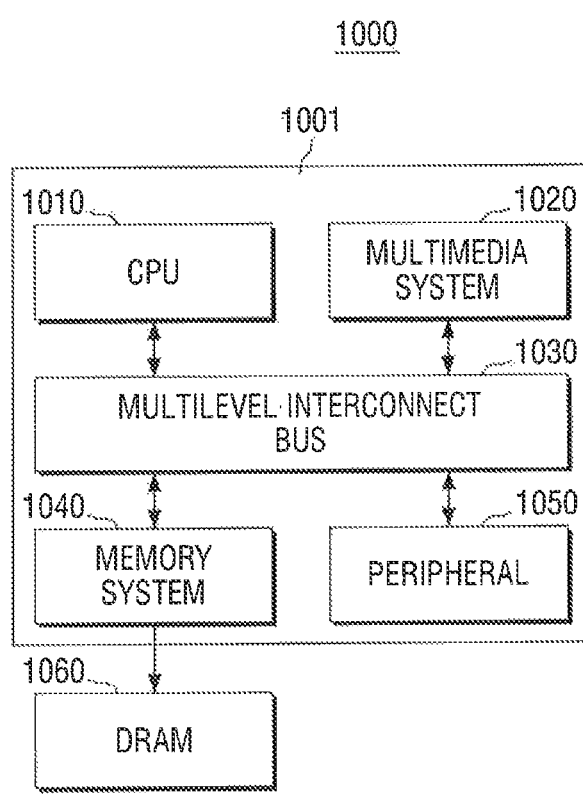
FIG. 23 is a system block diagram of a SoC (System on Chip) including a semiconductor device according to an exemplary embodiment of the inventive concept.

FIG. 23 is a system block diagram of a System on Chip (SoC) including a semiconductor device according to an exemplary embodiment of the inventive concept.

Referring to FIG. 23, the SoC 1000 may include an application processor 1001 and a DRAM device 1060. The application processor 1101 may include a central processing unit 1010, a multimedia system 1020, a bus 1030, a memory system 1040, and a peripheral circuit 1050.

The central processing unit 1010 may perform operations required for driving the SoC 1000. The multimedia system 1020 may include a three-dimensional engine module, a video codec, a display system, a camera system, or a post-processor. The central processing unit 1010, the multimedia system 1020, the memory system 1040, and the peripheral circuit 1050 may communicate with each other through the bus 1030. The bus 1030 may have a multi-layer structure, for example, a multi-layer advanced high-performance bus (AHB) or a multi-layer advanced extensible interface (AXI).

The memory system 1040 may provide a required environment for performing a high-speed operation while the application processor 1001 is connected with an external device. The external device may be a DRAM device. The peripheral circuit 1050 may allow the SoC 1000 to connect with an external device. In this case the external device may be a main board. The DRAM device 1060 may be disposed outside the application processor 1001 as shown in FIG. 23. The DRAM device 1060 may be packaged with the application processor 1001 to form a package type of a Package on Package (PoP).

At least one element of the SoC 1000 may include a semiconductor device according to an exemplary embodiment of the inventive concept.

Figure 24:
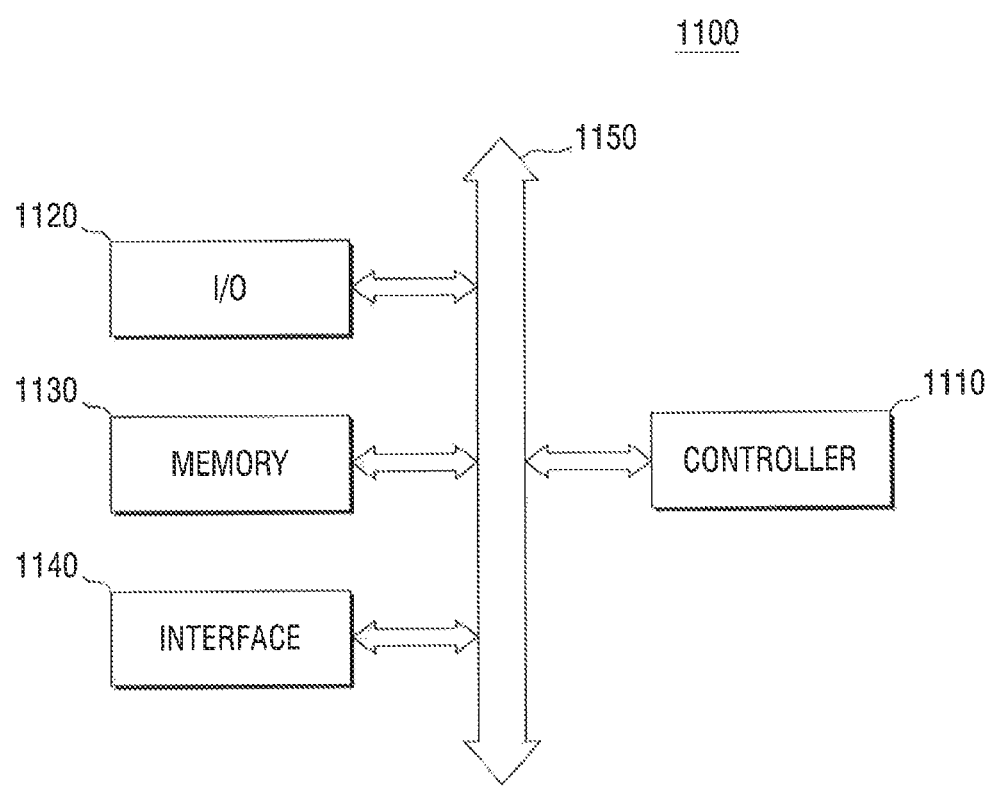
FIG. 24 is a block diagram of an electronic system including a semiconductor device according to an exemplary embodiment of the inventive concept.

FIG. 24 is a block diagram of an electronic system including a semiconductor device according to an exemplary embodiment of the inventive concept.

Referring to FIG. 24, an electronic system 1100 may include a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a signal path through which data may be transferred.

The controller 1110 may include a microprocessor, a digital signal processor, a microcontroller, or a similar device that may control an executive program. The input/output device 1120 may include a keypad, a keyboard, or a display. The memory device 1130 may not only store codes or data for executing the controller 1110 but also save data executed by the controller 1110. The memory device 1130 may include a semiconductor device according to an exemplary embodiment of the inventive concept.

The system 1100 may be applied to a product that includes a PDA (personal digital assistant), a portable computer, a web tablet, a wireless phone, a mobile phone, a digital music player, or a memory card.

Figure 25:
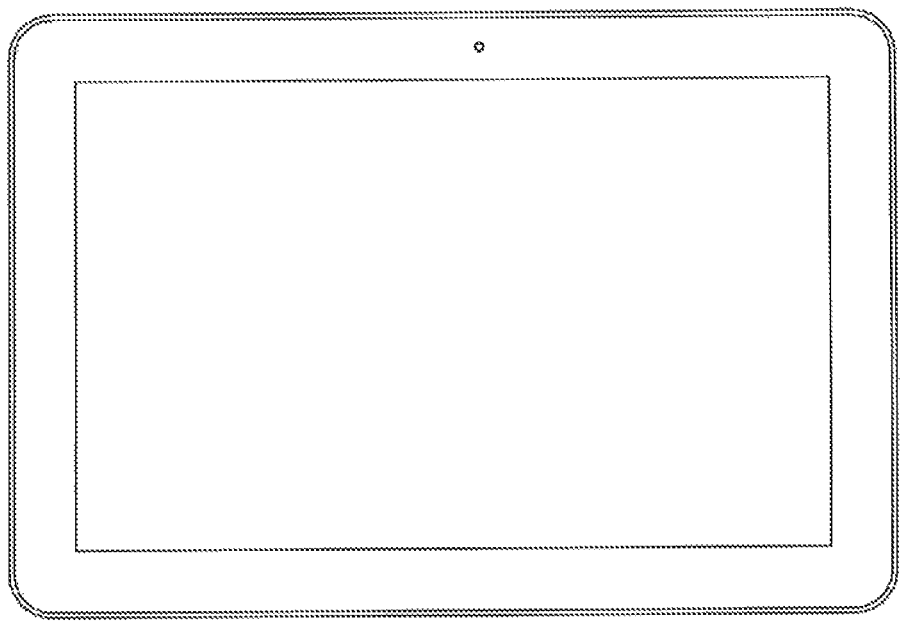
FIGS. 25 through 27 are several electronic products including semiconductor devices according to exemplary embodiments of the inventive concept.
Figure 26:
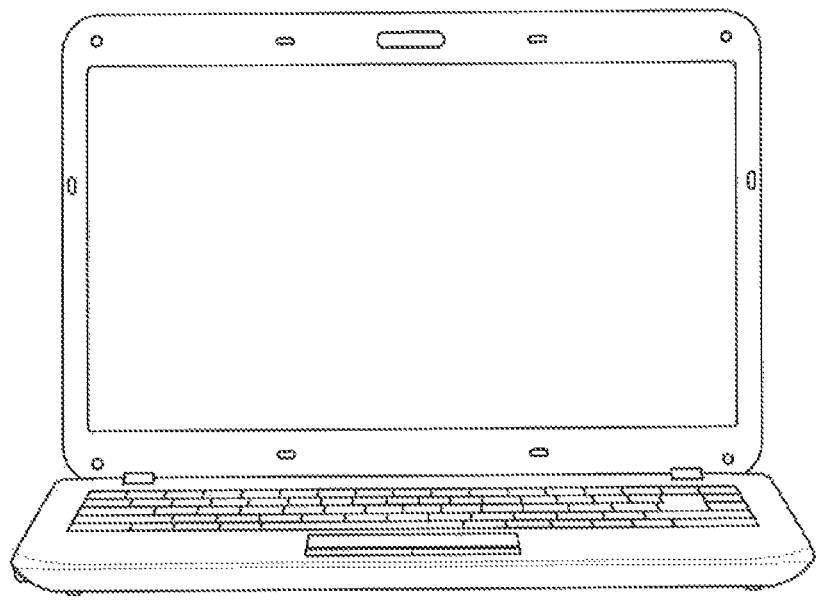
Figure 27:
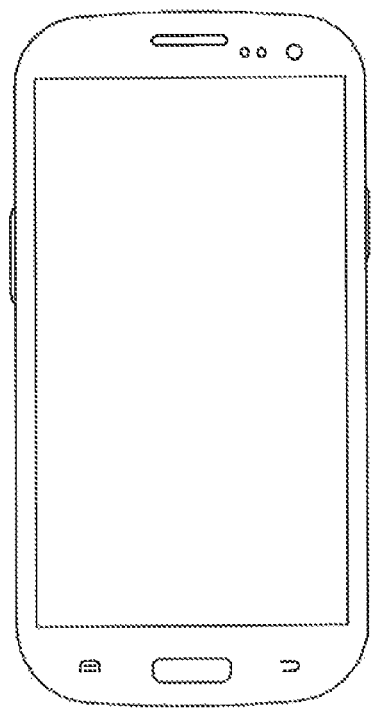

FIGS. 25 through 27 are several electronic products including semiconductor devices according to exemplary embodiments of the inventive concept. FIG. 25 is a view illustrating a tablet personal computer 1200, FIG. 26 is a view illustrating a notebook computer 1300, and FIG. 27 is a view illustrating a smart phone 1400. A semiconductor device according to at least one exemplary embodiment of the inventive concept may be applied to the tablet personal computer 1200, the notebook computer 1300, or the smart phone 1400.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
a first fin structure disposed on a substrate, the first fin structure extending in a first direction;
a first sacrificial layer pattern disposed on an upper surface of the first fin structure, the first sacrificial layer pattern including a left portion and a right portion arranged in the first direction, wherein the left portion and the right portion are separated from each other;
a dielectric layer pattern disposed on the upper surface of the first fin structure and interposed between the left portion and the right portion of the first sacrificial layer pattern;
a first active layer pattern disposed on the first sacrificial layer pattern and the dielectric layer pattern, the first active layer pattern extending in the first direction, wherein the first active layer pattern is in contact with the first sacrificial layer pattern and the dielectric layer pattern; and
a first gate electrode structure disposed on a portion of the first active layer pattern disposed on the dielectric layer pattern, the first gate electrode structure extending in a second direction crossing the first direction and the portion of the first active layer pattern being interposed between the dielectric layer pattern and the first gate electrode structure,
wherein the first fin structure protrudes in a third direction from the substrate, and
wherein the third direction is substantially perpendicular to the first and second directions.

2. The semiconductor device of claim 1, further comprising:
 a spacer disposed on a sidewall of the first gate electrode structure; and
 a source/drain structure disposed on the first active layer pattern,
 wherein the source/drain structure is separated from the first gate electrode structure by the spacer, and
 wherein the first sacrificial layer pattern is disposed under the source/drain structure without being disposed under the first gate electrode structure.

3. The semiconductor device of claim 2,
 wherein the source/drain structure is disposed on an upper surface and a sidewall of the first active layer pattern.

4. The semiconductor device of claim 1,
 wherein the first sacrificial layer pattern comprises a semiconductor material.

5. The semiconductor device of claim 4,
 wherein the semiconductor material is silicon germanium (SiGe).

6. The semiconductor device of claim 1,
 wherein the first gate electrode structure comprises a gate dielectric layer, a work-function control layer, and a metal gate electrode layer.

7. The semiconductor device of claim 6,
 wherein the gate dielectric layer is disposed on a sidewall and a bottom of the metal gate electrode layer.

8. The semiconductor device of claim 1,
 wherein the first active layer pattern comprises a same material as the first fin structure.

9. The semiconductor device of claim 1, further comprising:
 a second fin structure disposed on the substrate;
 a second sacrificial layer pattern disposed on the second fin structure, the second sacrificial layer pattern having a different material from the first sacrificial layer pattern;
 a second active layer pattern disposed on the second sacrificial layer pattern; and
 a second gate electrode layer disposed on the second active layer pattern.

10. The semiconductor device of claim 9,
 wherein the first sacrificial layer pattern comprises a semiconductor material and the second sacrificial layer pattern comprises silicon oxide.

11. The semiconductor device of claim 10,
 wherein the second sacrificial layer pattern is disposed under the second active layer pattern and extended in the first direction.

12. The semiconductor device of claim 1, further comprising:
 a second sacrificial layer pattern disposed on the substrate;
 a second active layer pattern disposed on the second sacrificial layer pattern; and
 a second gate electrode layer disposed on the second active layer pattern,
 wherein a dielectric layer pattern is not disposed under the second active layer pattern.

13. The semiconductor device of claim 5, further comprising:
 a second sacrificial layer pattern disposed on the substrate; and
 a second active layer pattern disposed on the second sacrificial layer pattern,
 wherein a first concentration of germanium (Ge) contained in the first sacrificial layer pattern is different from a second concentration of germanium (Ge) contained in the second sacrificial layer pattern.

14. The semiconductor device of claim 13, further comprising:
 a first source/drain structure disposed on an upper surface and a sidewall of the first active layer pattern; and
 a second source/drain structure disposed on an upper surface and a sidewall of the second active layer pattern,
 wherein a first impurity contained in the first source/drain structure is different in a conductivity type from a second impurity contained in the second source/drain structure.

* * * * *